(12) United States Patent
Kang et al.

(10) Patent No.: US 8,063,421 B2
(45) Date of Patent: Nov. 22, 2011

(54) THIN FILM TRANSISTOR HAVING A GRADED METAL OXIDE LAYER

(75) Inventors: Dong-hun Kang, Yongin-si (KR);
Stefanovich Genrikh, Suwon-si (KR);
I-hun Song, Seongnam-si (KR);
Young-soo Park, Yongin-si (KR);
Chang-jung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 178 days.

(21) Appl. No.: 12/007,038

(22) Filed: Jan. 4, 2008

(65) Prior Publication Data

US 2008/0203387 A1      Aug. 28, 2008

(30) Foreign Application Priority Data

Feb. 28, 2007  (KR) .................. 10-2007-0020528

(51) Int. Cl.
*H01L 31/062*  (2006.01)
*H01L 31/113*  (2006.01)

(52) U.S. Cl. .............................. 257/290; 257/59; 257/72

(58) Field of Classification Search .................. 257/59, 257/72, 290
See application file for complete search history.

(56) References Cited

U.S. PATENT DOCUMENTS

| | | | |
|---|---|---|---|
| 7,112,841 B2 * | 9/2006 | Eldridge et al. | 257/314 |
| 7,601,984 B2 * | 10/2009 | Sano et al. | 257/57 |
| 2006/0027805 A1 * | 2/2006 | Koo et al. | 257/59 |
| 2006/0108636 A1 | 5/2006 | Sano et al. | |
| 2006/0270066 A1 * | 11/2006 | Imahayashi et al. | 438/4 |

FOREIGN PATENT DOCUMENTS

| | | |
|---|---|---|
| JP | 2006-332613 | 12/2006 |
| KR | 10-2006-0058454 | 5/2006 |
| KR | 10-2006-0123765 | 12/2006 |

OTHER PUBLICATIONS

Office Action for corresponding Chinese Patent Application No. 200810080659.7 dated Jun. 8, 2010 with English translation.

* cited by examiner

*Primary Examiner* — Howard Weiss
(74) *Attorney, Agent, or Firm* — Harness, Dickey & Pierce, P.L.C.

(57) ABSTRACT

Provided are a thin film transistor and a method of manufacturing the same. The thin film transistor may include a gate; a channel layer; a source and a drain, the source and the drain being formed of metal; and a metal oxide layer, the metal oxide layer being formed between the channel layer and the source and the drain. The metal oxide layer may have a gradually changing metal content between the channel layer and the source and the drain.

12 Claims, 15 Drawing Sheets
(7 of 15 Drawing Sheet(s) Filed in Color)

THIN FILM TRANSISTOR HAVING A GRADED METAL OXIDE LAYER

PRIORITY STATEMENT

This application claims priority under 35 U.S.C. §119 to Korean Patent Application No. 10-2007-0020528, filed on Feb. 28, 2007, in the Korean Intellectual Property Office, the entire contents of which are incorporated herein by reference.

BACKGROUND

1. Field

Example embodiments relate to a switching device and a method of manufacturing the same, and more particularly, to a thin film transistor and a method of manufacturing the same.

2. Description of Related Art

Thin film transistors may be used as switching devices for flat panel display devices, for example, a liquid crystal display device or an organic light emitting display device.

The mobility or leakage current of a thin film transistor may vary significantly depending on the material and state of a channel layer of the thin film transistor.

The majority of the channel layer of the thin film transistor in conventional liquid crystal display devices may be an amorphous silicon layer. If the channel layer of the thin film transistor is an amorphous silicon layer, the charge mobility may be about 0.5 cm$^2$/Vs, which is low, and thus, it may be difficult to increase the operation speed of the conventional liquid crystal display devices.

Accordingly, research is being conducted to find ways to use a ZnO based material layer, for example, a Ga—In—Zn—O layer, having greater charge mobility than an amorphous silicon layer, as a channel layer for a thin film transistor. The mobility of the Ga—In—Zn—O layer may be several tens of times greater than that of the amorphous silicon layer, and thus, it may significantly increase the operation speed of a liquid crystal display device.

SUMMARY

Example embodiments may provide a thin film transistor which may have improved characteristics due to improved contact between a source and a drain of the thin film transistor.

Example embodiment may also provide a method of manufacturing the thin film transistor.

Example embodiments may provide a thin film transistor (TFT) which may include a gate; a channel layer; a source and a drain, the source and the drain being formed of metal; and a metal oxide layer, the metal oxide layer being formed between the channel layer and the source and the drain.

The metal oxide layer may have a gradually changing metal content between the channel layer and the source and the drain.

The metal content in the metal oxide layer may be gradually increased or decreased in a direction toward the channel layer.

The metal oxide layer may be a stoichiometric layer or a non-stoichiometric layer.

The metal oxide layer may include a transition metal having an oxidation characteristic higher than or similar to that of ZnO.

The source and the drain may be double-layers formed of metal.

The channel layer may be an oxide semiconductor layer.

The metal contained in the metal oxide layer may be the same as the metal of the source and the drain.

The gate may be formed above or under the channel layer or buried in the channel layer.

The transition metal may be one selected from the group consisting of Al, Ti, Mo, Cr or W.

The source and the drain may be formed of at least one selected from the group consisting of Ti, Mo, Cr, W, Zr, Hf, Nb, Ta, Ag, Au, Al, Cu, Co, Sb, V, Ru, Pt, Pd, Zn, and Mg.

The oxide semiconductor layer may be an a(In$_2$O$_3$).b(Ga$_2$O$_3$).c(ZnO) or an a(In2O3).b(ZnO).c(SnO) (where a, b, and c are integers satisfying a≧0, b≧0, and c>0, respectively).

Example embodiments may provide a method of manufacturing a thin film transistor (TFT) which may include forming a gate on a substrate, forming a gate insulating layer covering the gate on the substrate, forming a channel layer on the gate insulating layer, and forming a source and a drain by sequentially stacking a metal oxide layer and a metal layer on the channel layer and the gate insulating layer.

After forming the metal oxide layer and the metal layer, annealing a resultant structure may be performed.

The annealing may be performed between 250° C.~450° C. in a nitrogen atmosphere using a furnace, a rapid thermal annealing (RTA), or laser.

According to at least one example embodiment, the channel layer may be first formed on the substrate, and the source and the drain may be formed by sequentially stacking the metal oxide layer and the metal layer on the channel layer and the substrate, and the gate and the gate insulating layer may be formed after forming the source and the drain by forming the gate insulating layer to cover the channel layer, the metal oxide layer, and the metal layer, and forming the gate on the gate insulating layer.

Example embodiments may provide a method of manufacturing a thin film transistor (TFT) which may include forming a gate on a substrate, forming a gate insulating layer covering the gate on the substrate, forming a channel layer on the gate insulating layer, stacking a metal layer on the channel layer and the gate insulating layer, and forming a metal oxide layer between the metal layer and the channel layer.

The metal oxide layer may be formed by annealing a resultant structure including the metal layer.

The annealing may be performed using a furnace, rapid thermal annealing (RTA), or a laser.

The annealing may be performed between 250° C.~450° C. in an atmosphere containing nitrogen or oxygen.

The annealing may be performed in an oxygen atmosphere between 250° C.~450° C.

According to at least one example embodiment, the channel layer may be first formed on the substrate, and the metal layer may be formed on the channel layer and the substrate, and the gate insulating layer may be formed to cover the metal layer and the channel layer, and the metal oxide layer may be formed after forming the gate on the gate insulating layer.

Additionally, the channel layer may be first formed on the substrate, and the metal layer may be formed on the channel layer and the substrate, and then the metal oxide layer may be formed, and the gate insulating layer may be formed to cover the metal layer, the metal oxide layer, and the channel layer, and the gate may be formed on the gate insulating layer.

BRIEF DESCRIPTION OF THE DRAWINGS

The patent or application file contains at least one drawing executed in color. Copies of this patent or patent application publication with color drawing will be provided by the Office upon request and payment of the necessary fee.

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
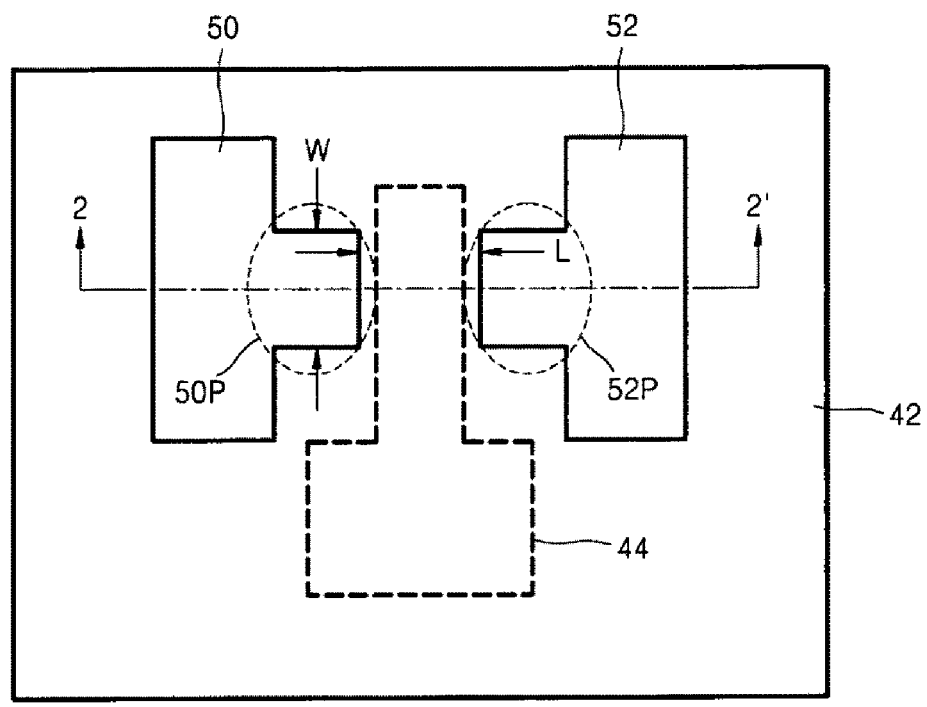
FIG. 1 is a plan view of a thin film transistor (TFT) according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements through the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between element should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The example embodiments will now be described more fully with reference to the accompanying drawings. The thicknesses of layers or regions illustrated in the drawings may be exaggerated for clarity.

First, a thin film transistor (TFT) according to at least one example embodiment will be described.

FIG. 1 is a plan view of the TFT according to at least one example embodiment. In FIG. 1, Reference numeral 42 denotes an insulating layer which may cover a substrate. The insulating layer 42 may be a silicon oxide layer having a thickness of 100 nm. Reference numerals 44, 50, and 52 respectively denote a gate, a source, and a drain. The positions of the source 50 and the drain 52 of the TFT may be exchanged with each other. A portion of each of the source 50 and the drain 52 may protrude toward each other and may form protrusions 50P and 52P. The space between a protrusion 50P of the source 50, which may have a predetermined or desired width W, and a protrusion 52P of the drain 52, which may have the same width W, is a channel region which may have a predetermined or desired length L. The source 50 and the drain 52 may be metal layers. For example, the source 50 and the drain 52 may be metal layers formed of at least one selected from the group consisting of Ti, Mo, Cr, W, Pt, Zr, Hf, Nb, Ta, Ag, Au, Al, Cu, Co, Sb, V, Ru, Pt, Pd, Zn, and Mg. Hence, the source 50 and the drain 52 may be pure metal layers or metal alloy layers.

Additionally, the source 50 and the drain 52 may be any electrically conductive metal layers. The source 50 and the drain 52 may also be double-layers formed of two sequentially stacked metal layers. The source 50 and the drain 52 may be formed of two sequentially stacked metal layers selected from the group consisting of Ti, Mo, Cr, W, Pt, Zr, Hf, Nb, Ta, Ag, Au, Al, Cu, Co, Sb, V, Ru, Pt, Pd, Zn, and Mg, for example, a titanium layer and a platinum layer sequentially stacked.

Figure 2:
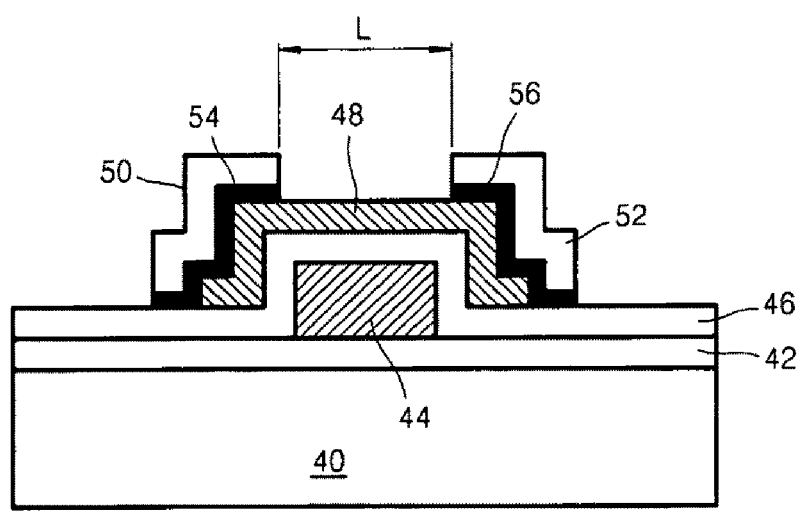
FIG. 2 is a cross-sectional view of a cut along line 2-2' of FIG. 1.

FIG. 2 is a cross-sectional view of a cut along 2-2' of FIG. 1, according to at least one example embodiment. Referring to FIG. 2, the insulting layer 42 may be formed on a substrate 40, which may be a semiconductor substrate, for example, a silicon substrate. A gate 44 may be formed on a predetermined or desired region of the insulating layer 42. The gate 44 of the TFT may be formed of molybdenum or other conductive materials. A gate insulating layer 46 may be formed on the insulating layer 42 and may cover the gate 44, and the gate insulating layer 46 may be a silicon oxide layer. A channel layer 48 may be formed on the gate insulating layer 46 and may cover the gate 44, and the channel layer 48 may be an oxide semiconductor layer, for example, a G-I—Z—O layer, that is, $[a(In_2O_3).b(Ga_2O_3).c(ZnO)]$ layer] or $[a(In2O3).b(ZnO).c(SnO)]$ (where a, b, and c are integers satisfying $a \geqq 0$, $b \geqq 0$, and $c > 0$, respectively). A first metal oxide layer 54 and a second metal oxide layer 56 may be formed separate from each other on the surface of the channel layer 48, and the first and second metal oxide layers 54 and 56 may face each other. The first metal oxide layer 54 may be formed between the source 50 and the channel layer 48. The second metal oxide layer 56 may be formed between the drain 52 and the channel layer 48. The first metal oxide layer 54 may be formed on a side of the channel layer 48 and may be extended over an upper surface of the channel layer 48. The second metal oxide layer 56 may be formed on another side of the channel layer 48 and may be extended over the upper surface of the channel layer 48. The source 50 may be in contact with an upper surface of the first metal oxide layer 54, and the drain 52 may be in contact with an upper surface of the second metal oxide layer 56. The first and second oxide layers 54 and 56 may be a stoichiometric or a non-stoichiometric layer. Additionally, the first and second oxide layers 54 and 56 may be metal oxide layers having a gradually changing metal content. For example, the first and second metal oxide layers 54 and 56 may be titanium oxide layers in which the content of titanium may be increased or decreased in a direction from the source 50 and the drain 52 to the channel layer 48. Additionally, the first and second metal oxide layers 54 and 56 may include a transition metal which may have a higher oxidation characteristic than ZnO, and the transition metal may be Al, Ti, Mo, Cr or W. The first and second metal oxide layers 54 and 56 may form ohmic contacts with the source 50 and the drain 52, respectively, and may form a hetero-junction with the channel layer 48; and the thickness of the first and second metal oxide layers 54 and 56 may be 3 Å-300 Å.

Figure 3:
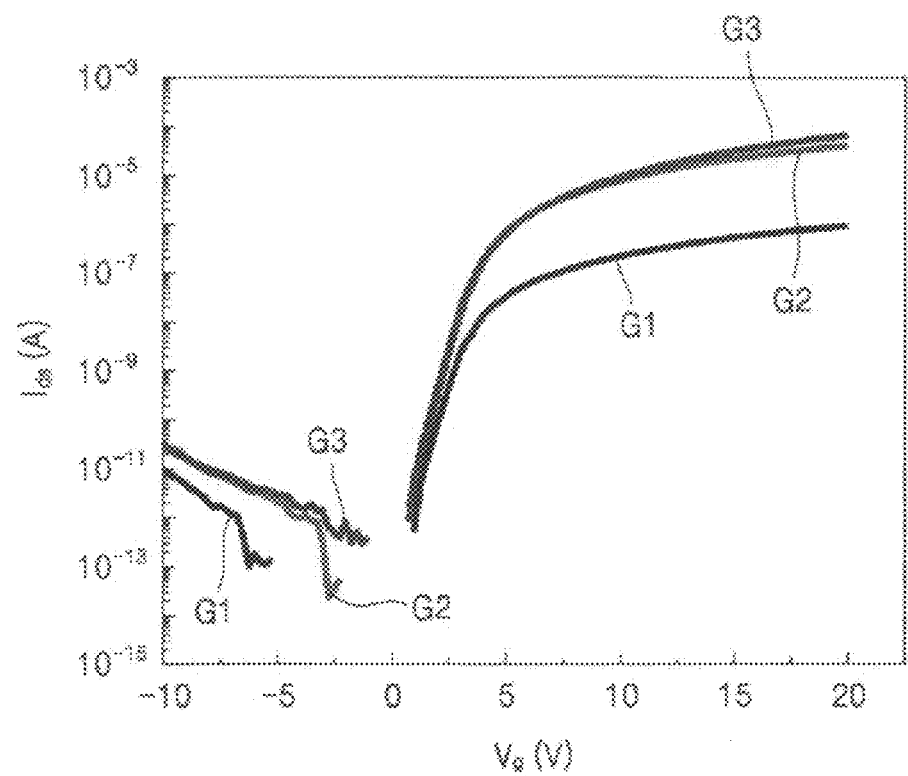
FIGS. 3 through 8 are graphs showing electrical characteristics of first, second, and third TFTs, according to the example embodiments.
Figure 4:
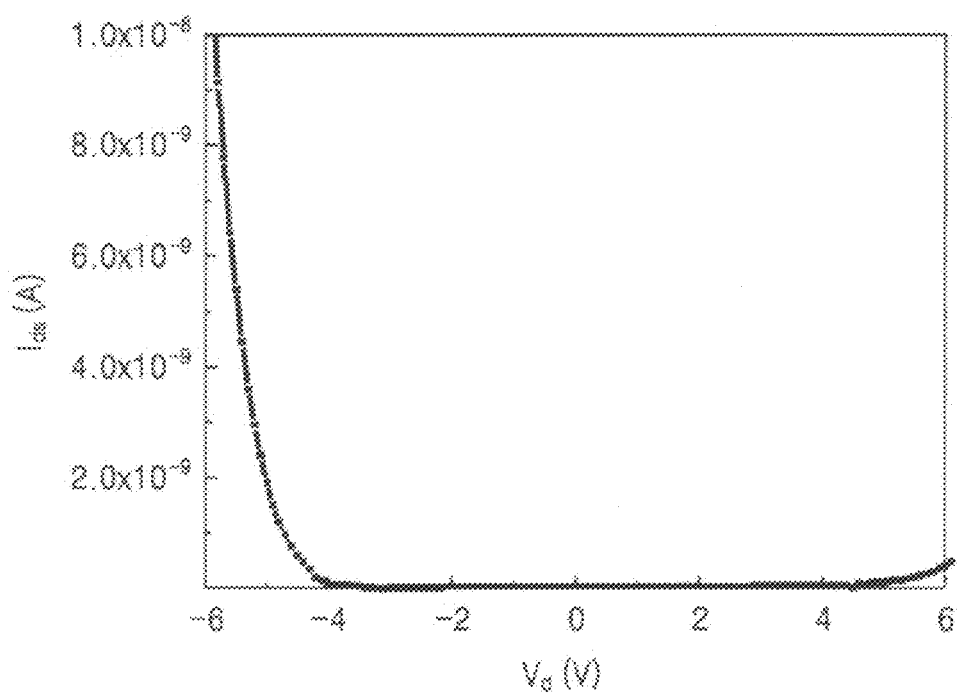

FIGS. 3 through 8 are graphs showing electrical characteristics of a first, a second, and a third TFT, according to the example embodiments;

In the first TFT, the source 50 and the drain 52 respectively are sequentially stacked Ti/Pt layer; the first and second metal oxide layers 54 and 56 are titanium oxide layers; the channel layer 48 is a G-I—Z—O layer, for example, a GIZO221 layer; a ratio of the width W of the protrusions 50P and 52P of the source 50 and the drain 52 to the length L of the channel layer 48 (W/L) is 50/20; and the first TFT is annealed for a predetermined or desired period of time, for example, 1 hour, at 350° C. FIG. 3 is a graph showing the current-voltage characteristic of the first TFT, according to at least one example embodiment. FIG. 4 is a graph showing variations in the current between the source 50 and the drain 52 according to the voltage that is applied to the drain 52 when no voltage is applied to the gate 44 in the first TFT, according to at least one example embodiment.

In FIG. 3, first through third graphs G1 through G3 show the characteristics between a gate voltage $V_g$ and a source-drain current Ids when voltages of 0.1 V, 5 V, and 10 V are applied to the drain 52.

Referring to FIG. 3, when the gate voltage $V_g$ is 0 V regardless of a voltage that is applied to the drain 52, the source-drain current $I_{ds}$ of the TFT is substantially 0, and as the gate voltage $V_g$ that is applied is increased to be greater than 0 V, a significant source-drain current $I_{ds}$ is measured at a threshold voltage or higher. Additionally, referring to FIG. 4, when no voltage is applied to the gate 44 and a voltage from 0 V to +4 V or −4 V is applied to the drain 52, there is no current flowing between the source 50 and the drain 52, which may indicate that the first TFT is operating in an enhanced mode.

Figure 5:
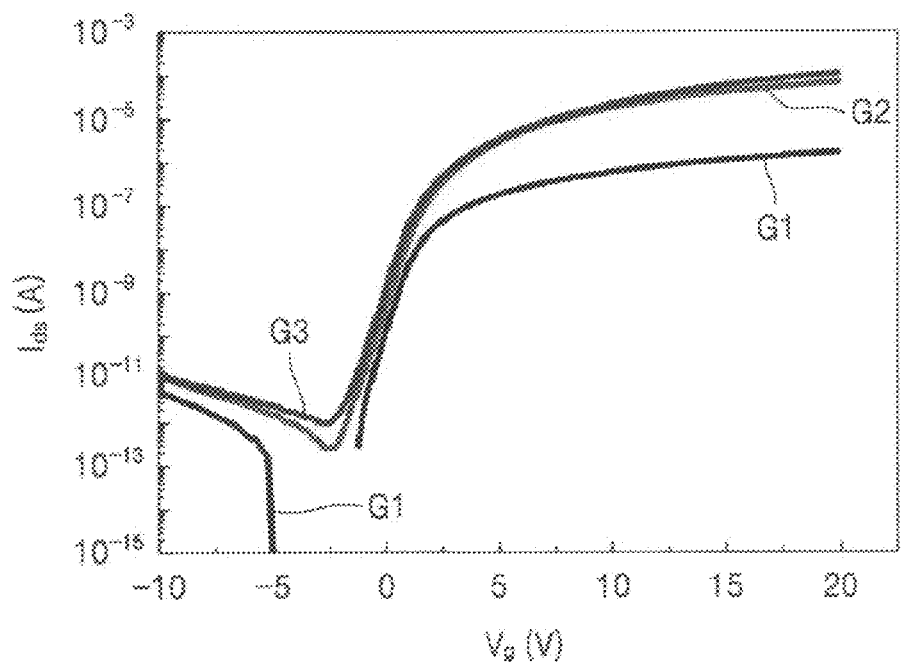
Figure 6:
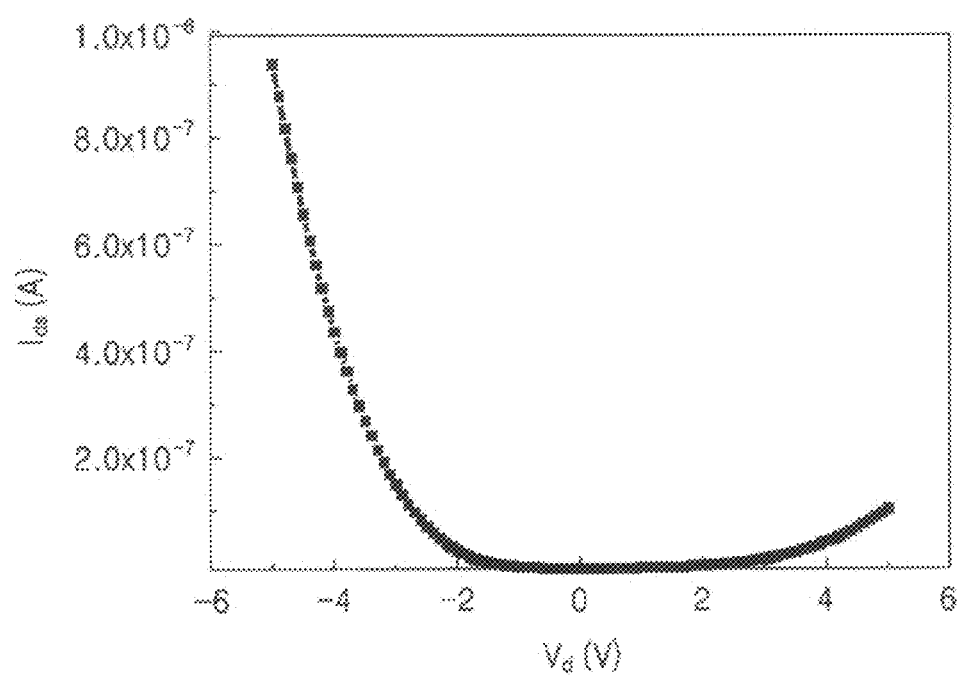

FIGS. 5 and 6 show electrical characteristics of the second TFT, according to at least one example embodiment. The second TFT is the same as the first TFT used to obtain the results of FIGS. 3 and 4 except that the second TFT includes the source 50 and the drain 52 which are respectively formed of a chromium layer and a platinum layer that are sequentially stacked, and the first and second metal oxide layers 54 and 56 are formed of chromium oxide layers. In FIG. 5, first through third graphs G1 through G3 show the characteristics between a gate voltage $V_g$ and a source-drain current $I_{ds}$ when voltages of 0.1 V, 5 V, and 10 V are applied to the drain 52.

Referring to FIG. 5, the second TFT may show similar electrical characteristics to the current-voltage characteristics of the first TFT as illustrated in FIG. 3. Additionally, referring to FIG. 6, as no voltage is applied to the gate 44, the current flowing between the source 50 and the drain 52 of the second TFT does not flow when the voltage that is applied to the drain 52 is from 0 V to +2 V or −2 V and thus, the second TFT is operating in an enhanced mode.

Figure 7:
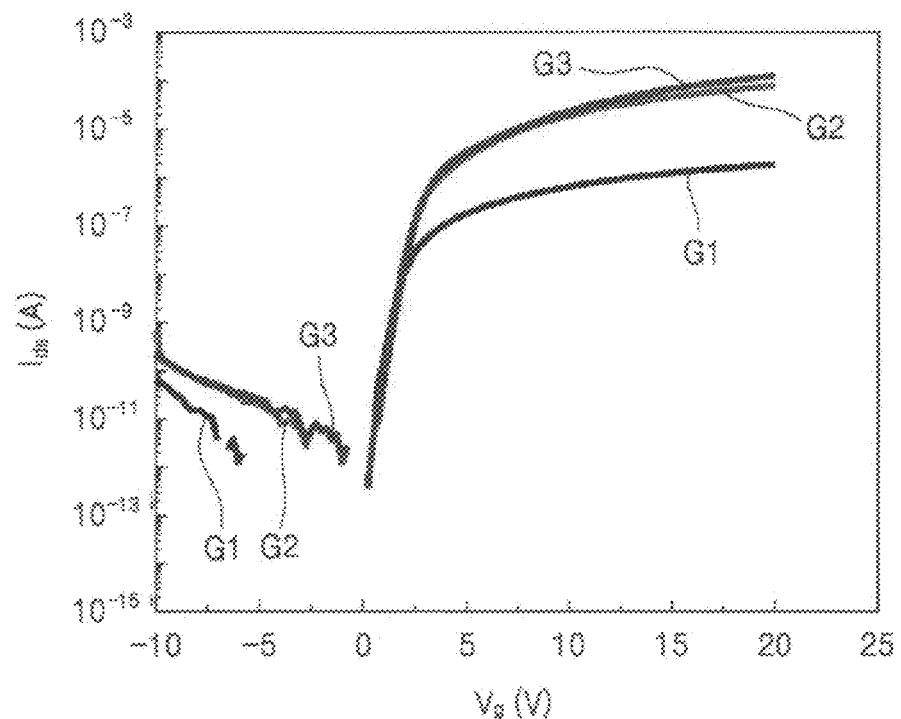
Figure 8:
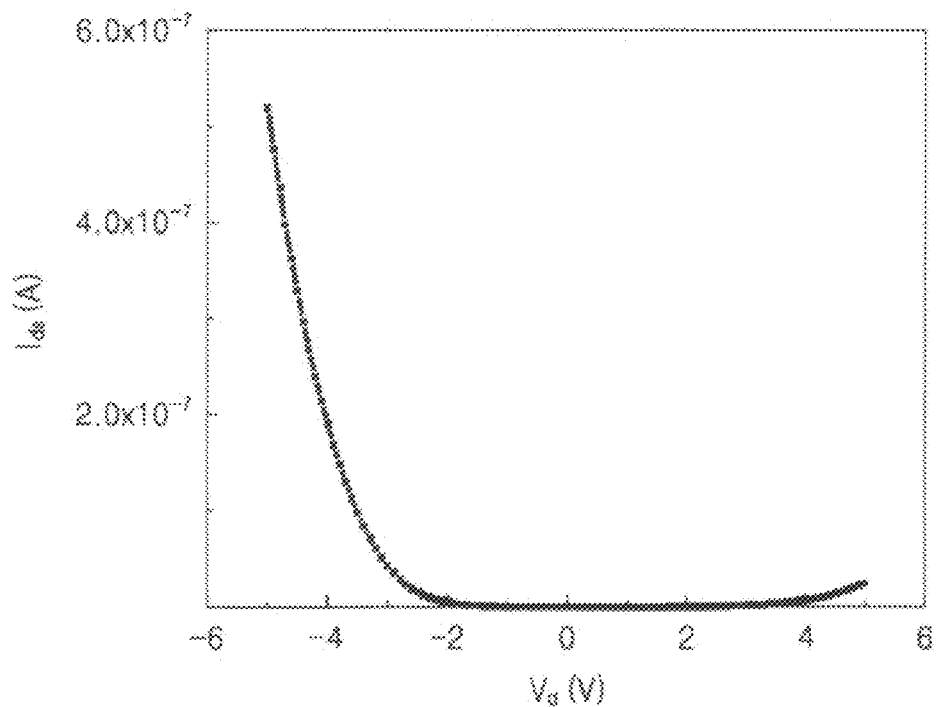

FIGS. 7 and 8 show electrical characteristics of the third TFT according to at least one example embodiment. The third TFT is the same as the first TFT except for the configuration of the source 50 and the drain 52 and the first and second metal oxide layers 54 and 56. Thus, the third TFT includes the source 50 and the drain 52 respectively formed of a tungsten layer and a platinum layer that are sequentially formed. The first and second metal oxide layers 54 and 56 are tungsten oxide layers. In FIG. 7, first through third graphs G1 through G3 show the characteristics between a gate voltage $V_g$ and a source-drain current $I_{ds}$ when voltages of 0.1 V, 5 V, and 10 V are applied to the drain 52.

Referring to FIG. 7, the current-voltage characteristic of the third TFT may be similar to the electrical characteristics of the first and second TFTs. Referring to FIG. 8, as no voltage is applied to the gate 44, the current flowing between the source 50 and the drain 52 of the second TFT does not flow when the voltage that is applied to the drain 52 is from 0 V to +4 V or −2 V, and thus, the third TFT is also operating in an enhanced mode.

Because the TFTs according to example embodiments may operate in an enhanced mode, there may be no leakage current in the TFTs according to the example embodiments whereas leakage current may occur in the conventional TFT operating in a depletion mode.

Figure 9:
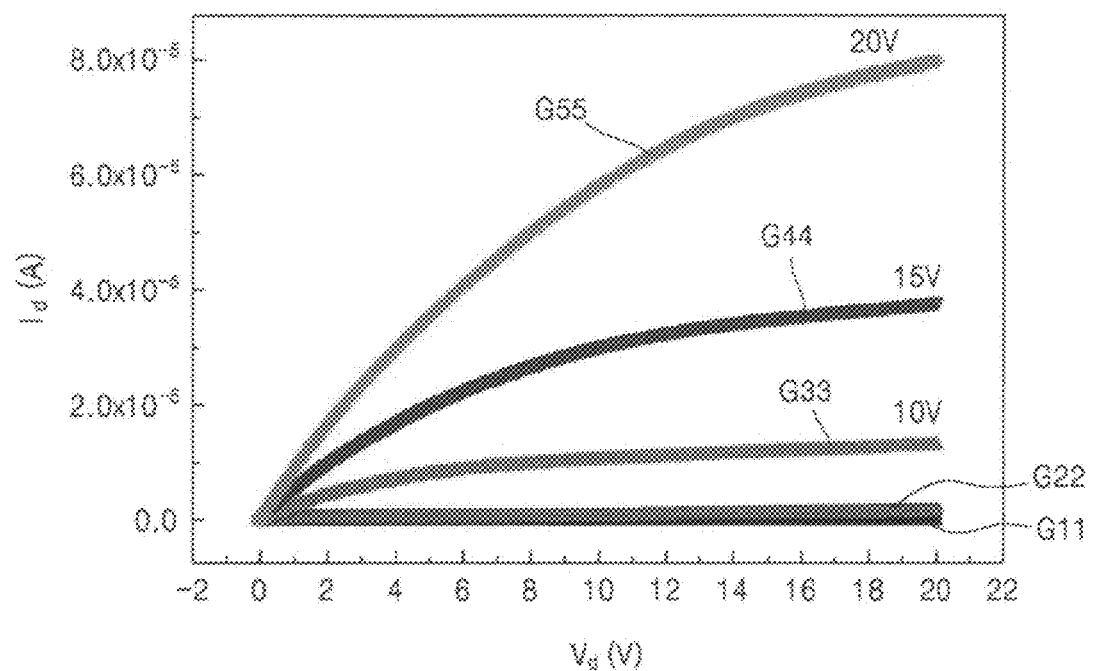
FIG. 9 is a graph showing the drain current ($I_d$)-drain voltage ($V_d$) of the first TFT, according to at least one example embodiment.

FIG. 9 shows drain current ($I_d$) versus drain voltage ($V_d$) characteristics of the first TFT, according to at least one example embodiment. First and second graphs G11 and G22 show $I_d$-$V_d$ characteristics measured at a voltage lower than 10 V (e.g., 0.1 V or less than 5 V) that are applied to the gate 44. Third through fifth graphs G33 through G55 show $I_d$-$V_d$ characteristics when voltages of 10 V, 15 V, and 20 V are applied to the gate 44. Referring to the first through fifth graphs G11 through G55, when a voltage that is applied to the gate 44 is 10 V or greater, the drain current $I_d$ may increase as the drain voltage $V_d$ is increased. Additionally, the drain current $I_d$ may increase as the voltage that is applied to the gate 44 is increased.

Referring to FIG. 9, the TFT according to the example embodiments may demonstrate improved leakage current as compared to the conventional TFT where the drain current $I_d$ is observed when a voltage greater than 0 V is applied to a gate, regardless of the amount of voltage greater than 0V that is applied to the gate.

Experiments were conducted in order to determine how the TFT characteristics may vary when the TFT does not include the first and second metal oxide layers 54 and 56.

To conduct the experiments, the first and second metal oxide layers 54 and 56 were removed from the TFT and the source 50 and the drain 52 were formed of platinum layers. The rest of the conditions were set the same as the first TFT.

Figure 10:
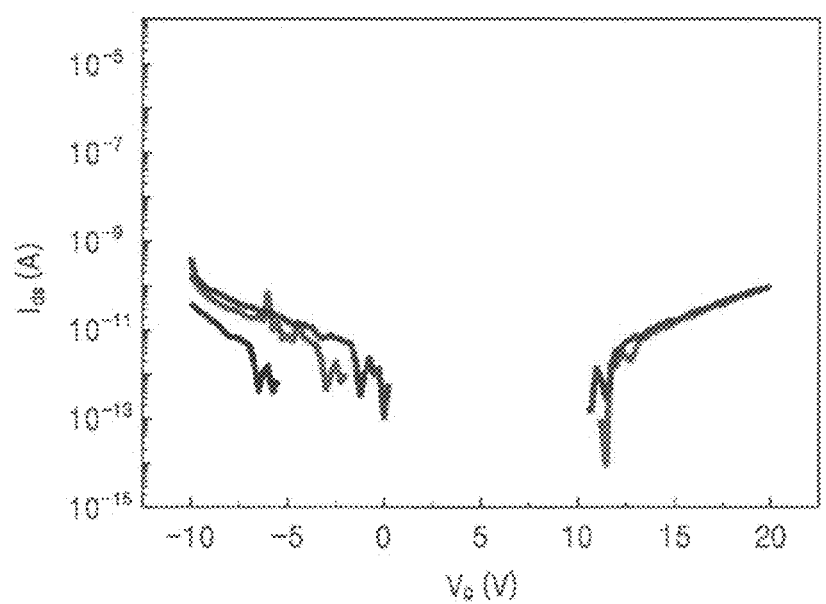
FIG. 10 is a graph showing the gate voltage-the source and drain current characteristics of a TFT, according to at least one example embodiment, used in experiments.
Figure 11:
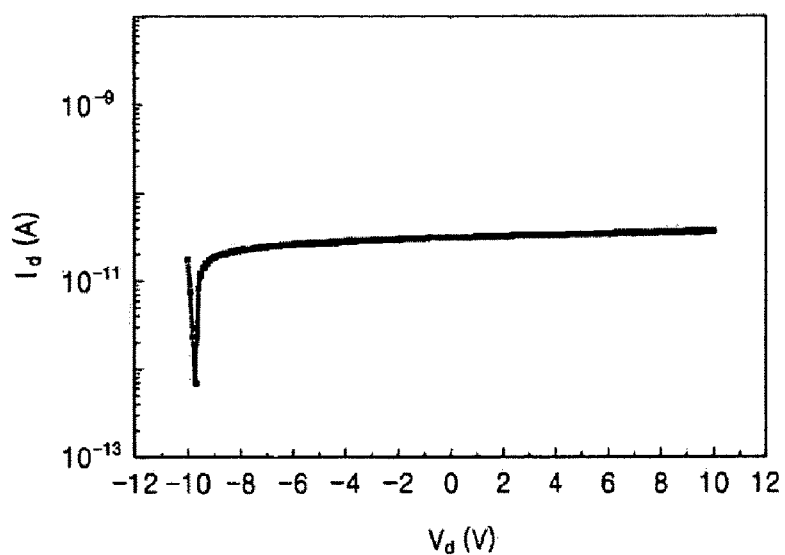
FIG. 11 is a graph showing the drain current-drain voltage characteristic of the TFT used in experiments.

FIG. 10 shows the gate voltage $V_g$-source/drain current $I_{ds}$ characteristics of the TFT used in the experiments, according to at least one example embodiment. FIG. 11 shows drain current-drain voltage characteristic of the TFT used in the experiments, according to at least one example embodiment.

Referring to FIG. 10, no source/drain current $I_{ds}$ is measured until the gate voltage $V_g$ reaches 10 V or higher. When the gate voltage is 10 V or greater, the source/drain current $I_{ds}$ is measured, however, the amount of source/drain current $I_{ds}$ is about $10^{-11}$ (A), which is very low, and may be regarded as no source/drain current $I_{ds}$. The measured source/drain current $I_{ds}$ as shown in FIG. 11 is about $10^{-11}$ (A), which is very low and may be regarded as no flowing drain current $I_d$.

As can be seen from the results of FIGS. 10 and 11, when there are no first and second metal oxide layers 54 and 56 between the source 50 and the drain 52 and the channel layer 48, barriers blocking carrier transportation may be formed between the source 50 and the drain 52, and the channel layer 48. Thus, the presence of the first and second metal oxide layers 54 and 56 may lower the barriers.

Hereinafter, a method of manufacturing a TFT according to at least one example embodiment will be described.

Figure 12:
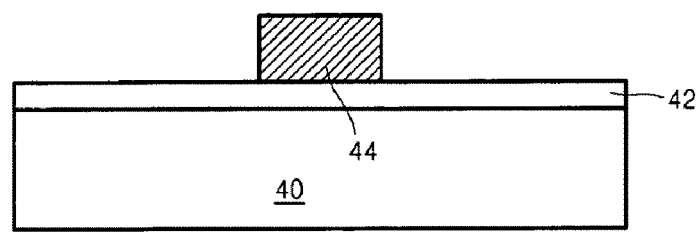
FIGS. 12 through 15 are cross-sectional views of a method of manufacturing a TFT according to at least one example embodiment.

Referring to FIG. 12, the insulating layer 42 may be formed on the substrate 40. The substrate 40 may be a silicon substrate. The insulating layer 42 may be formed of a silicon oxide layer to a thickness of about 100 nm. The gate 44 may be formed on a predetermined or desired region of the insulating layer 42. The gate 44 may be formed of a conductive material, for example, molybdenum (Mo).

Figure 13:
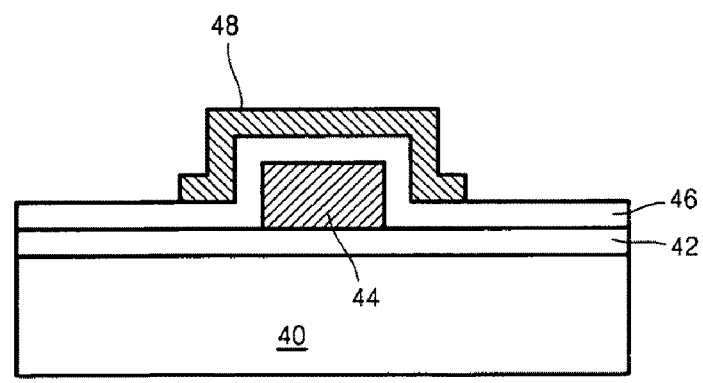

Referring to FIG. 13, the gate insulating layer 46 may be formed on the insulating layer 42 covering the gate 44. The gate insulating layer 46 may be formed of a silicon oxide layer. The channel layer 48 may be formed on a predetermined or desired region of the gate insulating layer 46 which may cover the gate 44. The channel layer 48 may be formed to cross over the gate 44. The channel layer 48 may be formed of an oxide semiconductor layer, for example, a G—I—Z—O layer.

Figure 14:
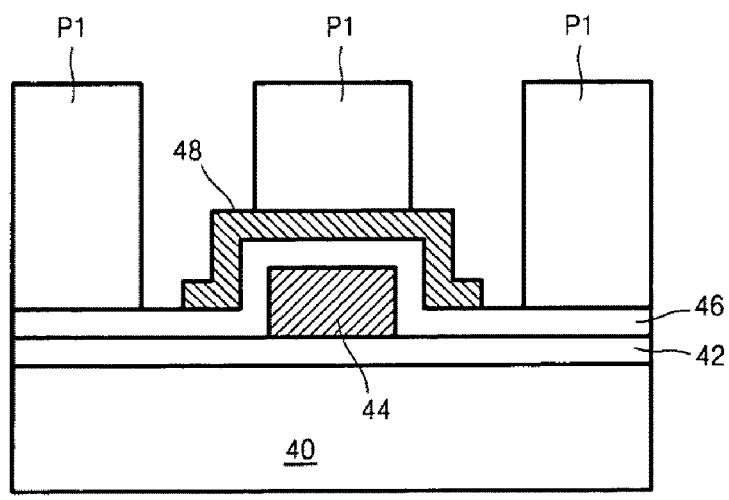

Referring to FIG. 14, a photosensitive pattern P1 may be formed on the substrate 40 to expose a portion of the channel layer 48 and a portion of the gate insulating layer 46. The photosensitive pattern P1 may cover a portion of an upper surface of the channel layer 48. The portions of the photosensitive pattern P1 that cover the gate insulating layer 46 around the channel layer 48 may be separate from the channel layer 48. Accordingly, after the photosensitive pattern P1 is formed, the rest of the channel layer 48, except for a portion which may cover the gate 44, may be exposed. Additionally, a portion of the gate insulating layer 46 between the channel layer 48 and the photosensitive pattern P1 may be exposed. A source and a drain may be formed in the exposed regions after the photosensitive pattern P1 is formed. The planar surface of the exposed portions after the photosensitive pattern P1 is formed may be the same as the surface covered by the source 50 and the drain 52 of FIG. 1.

Figure 15:
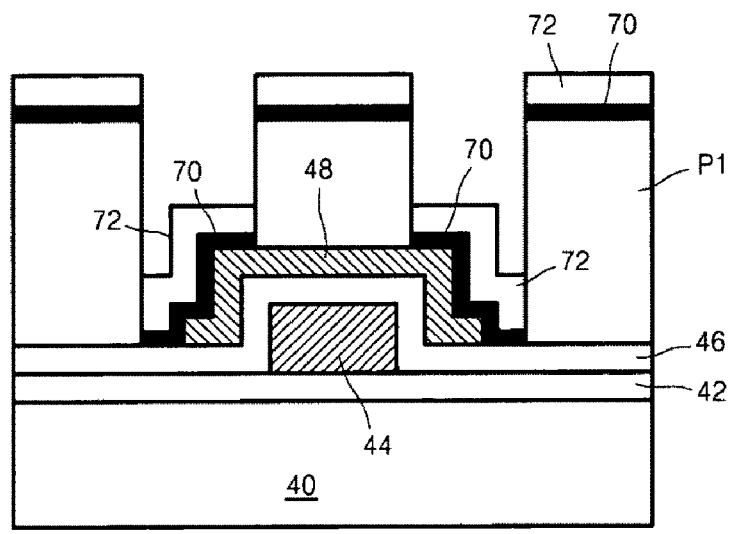

Referring to FIG. 15, a metal oxide layer 70 and a metal layer 72 may be formed on the exposed portions of the channel layer 48, and the gate insulating layer 46. The metal oxide layer 70 and the metal layer 72 may also be sequentially stacked on the photosensitive pattern P1. The metal oxide layer 70 may be formed of the same material as the first and second metal oxide layers 54 and 56 of the TFT according to at least one example embodiment. The metal layer 72 may be formed of the same material as the source 50 and the drain 52 of the TFT according to the example embodiments. The metal oxide layer 70 may be formed to a thickness of 3 Å-300 Å, and the metal layer 72 may be formed to a thickness of 500 Å-1500 Å. The metal layer 72 may be formed to a thickness of about 500 Å when the metal layer 72 is a titanium layer or a platinum layer. The metal layer 72 may be formed as a single layer or a double layer. If the metal layer 72 is a double layer, an upper layer may be a platinum layer. The metal oxide layer 70 and the metal layer 72 may be formed using a sputtering method, a deposition method using electron beams, an atomic layer deposition method, or a chemical vapor deposition method.

If the metal oxide layer 70 is formed using the sputtering method, a predetermined or desired amount of sputtering gas and oxygen may be supplied to a reaction chamber. The sputtering gas may be argon (Ar) gas. If the metal oxide layer 70 is a titanium oxide ($TiO_2$) layer, the metal oxide layer 70 may be formed by supplying Ar gas and oxygen to the reaction chamber such that the content of Ar gas is 35% and the oxygen content is about 15%, and by applying power of 1 kW to a sputtering target. The pressure of the reaction chamber may be maintained constant at about 3 mtorr.

Among the metal oxide layers 70, which may be stacked on the exposed region of the channel layer 48 and the gate insulating layer 46, the layer to the left of gate 44 may correspond to the first metal oxide layer 54 in FIG. 2, and the layer to the right of gate 44 may correspond to the second metal oxide layer 56 in FIG. 2. And among the metal layers 72, which may be formed on the metal oxide layers 70, the layer to the left of gate 44 may correspond to the source 50 in FIG. 2 and the layer to the right of gate 44 may correspond to the drain 52 in FIG. 2.

Furthermore, the photosensitive pattern P1 may be lifted off from the resultant structure illustrated in FIG. 15 along with the metal oxide layer 70 and the metal layer 72, which may be stacked on the photosensitive pattern P1. After the photosensitive pattern P1 is lifted off, the TFT as illustrated in FIG. 2 may be formed.

However, a portion of the metal oxide layer 70 corresponding to the first and second metal oxide layers 54 and 56 of FIG. 2 (hereinafter "first portion") and a portion of the metal layer 72 corresponding to the source 50 and the drain 52 (hereinafter "second portion") may be preferably formed using a lift-off method in which the first portion and the second portion may be defined by forming the photosensitive pattern P1. However, the first and second portions may also be formed using a conventional photographic etching process. For example, the first and second portions may be formed by sequentially stacking the metal oxide layer 70 and the metal layer 72, forming a mask covering regions to be formed as the first and second portions on the metal layer 72, and then sequentially etching the metal layer 72 and the metal oxide layer 70.

After forming the TFT, the TFT may be annealed in a furnace with a nitrogen atmosphere between 200° C.~450° C. for about 1 hour. However, the annealing time may be shorter or longer than 1 hour. Additionally, the annealing may be performed using a rapid thermal annealing (RTA) method or using a laser method.

Figure 16:
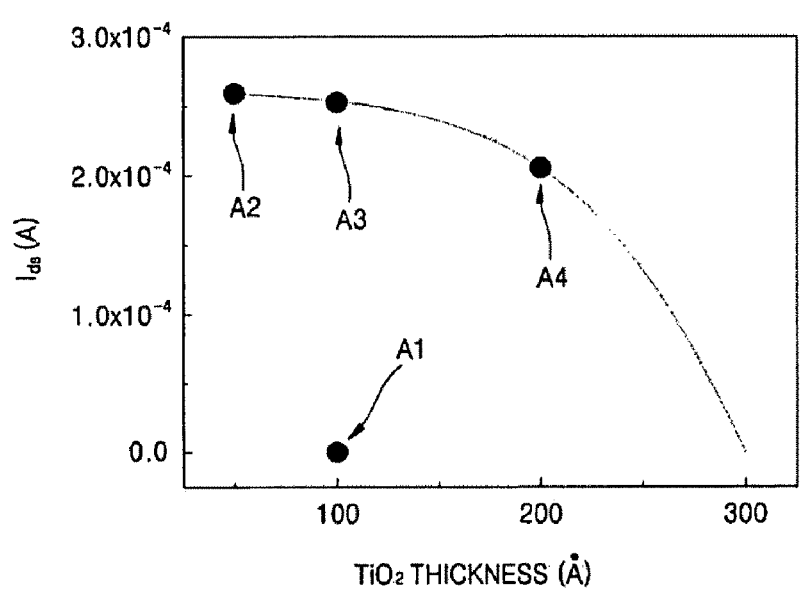
FIG. 16 is a graph showing source-drain current ($I_{ds}$) versus the thickness of a metal oxide layer based on the method of manufacturing a TFT, according to at least one example embodiment.

FIG. 16 is a graph showing source-drain current ($I_{ds}$) based on the thickness of the metal oxide layer 70 in the TFT according to at least one example embodiment. The TFT used in FIG. 16 includes the metal layer 72 formed of a platinum layer or a titanium layer, and the metal oxide layer 70 formed of a titanium oxide ($TiO_2$) layer. A voltage $V_d$ that was applied to the drain 52 of the TFT was maintained constant at 10 V.

In FIG. 16, a first point A1 is the result of the TFT including the metal layer 72, which corresponds to the source 50 and the drain 52, formed of a platinum layer, and the metal oxide layer 70 formed of a titanium oxide layer having a thickness of 100 Å. Second through fourth points A2 through A4 show the source-drain currents in the TFT in which the metal layer 72 is a titanium layer.

Referring to the first point A1, when the metal layer 72 is a platinum layer and the thickness of the metal oxide layer 70 that is formed of a titanium oxide layer is 100 Å, the source-drain current $I_s$ is 0 Amps. However, referring to the second through fourth points A2 through A4, if the metal layer 72 is a titanium layer and the metal oxide layer 70 is a titanium oxide layer, the source-drain current $I_{ds}$ may be sufficiently high. As the thickness of the metal oxide layer 70 is lessened, the source-drain current $I_{ds}$ may increase; as the thickness of the metal oxide layer 70 is increased, the source-drain current $I_{ds}$ may decrease.

Figure 17:
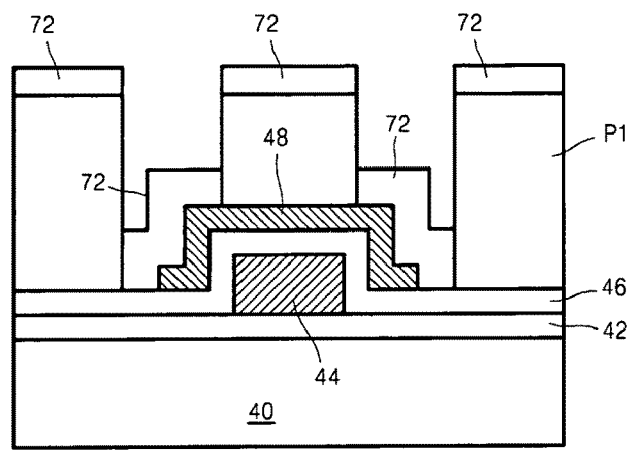
FIGS. 17 through 19 are cross-sectional views of a method of manufacturing a TFT according to at least one example embodiment.
Figure 18:
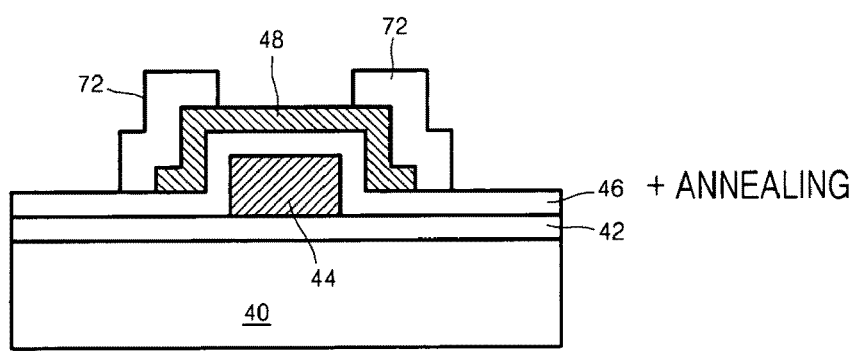
Figure 19:
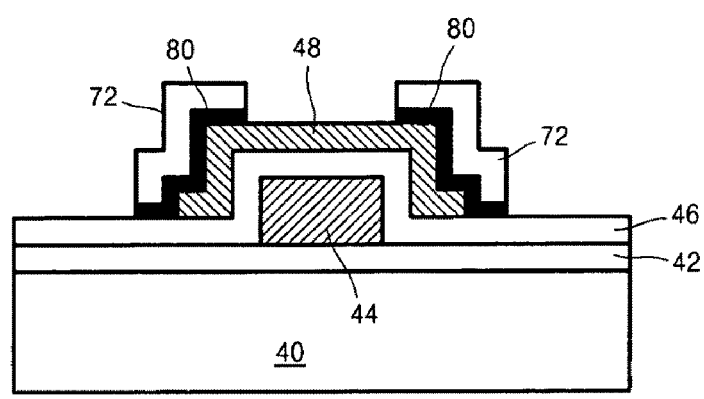

FIGS. 17 through 19 are cross-sectional views of a method of manufacturing a TFT according to at least one example embodiment.

In the method of manufacturing the TFT according to at least one example embodiment, after forming the channel layer 48, the metal layer 72 may be formed to be in contact with the channel layer 48, and the metal oxide layer 70 may be formed between the channel layer 48 and the metal layer by annealing the resultant structure. Reference numerals common to the previous embodiment may denote the same elements described with reference to the previous embodiment.

In detail, processes before forming the channel layer 48 and the photosensitive pattern P1 for a lift-off process (see FIG. 14) may be the same as in the method described with reference to the previous embodiment.

After forming the photosensitive pattern P1, the metal layer 72, which may have a predetermined or desired thickness, may be formed on an exposed region of the channel layer 48 and the gate insulating layer 46 as illustrated in FIG. 17. The metal layer may also be formed on the photosensitive pattern P1. Then, the photosensitive pattern P1 may be lifted off, and accordingly, the metal layer 72 that is formed on the photosensitive pattern P1 may also be lifted off. After lifting off the photosensitive pattern P1, as illustrated in FIG. 18, positions corresponding to the source 50 and the drain 52 of FIG. 2 may be the only positions where the metal layer 72 remains.

Then, the resultant structure of the TFT illustrated in FIG. 18 may be annealed according to predetermined or desired conditions. Thus, as illustrated in FIG. 19, a metal oxide layer 80 may be formed between the metal layer 72 and the channel layer 48, and the metal oxide layer 80 may correspond to the first and second metal oxide layers 54 and 56 of FIG. 2. A metal included in the metal oxide layer 80 may originate from the metal in the metal layer 72. Oxygen included in the metal oxide layer 80 may be supplied from at least one of the channel layer 48 and oxygen contained in the atmospheric gas during annealing. If the channel layer 48 contains sufficient oxygen to form the metal oxide layer 80, for example, if the channel layer 48 is an oxygen rich GIZO layer, the annealing atmospheric gas may not contain oxygen. The annealing may be performed at 200° C. to 450° C. Additionally, the annealing may be performed using not only a furnace, however, also RTA or a laser. The annealing may be performed for a predetermined or desired period of time, for example, 1 hour. The atmospheric gas of the annealing may contain nitrogen ($N_2$) or oxygen ($O_2$) according to the annealing method, or only oxygen. By controlling the annealing conditions, the metal oxide layer 80 may be formed to have the same properties as the metal oxide layer 70 of the previous embodiment.

When the annealing is completed, the manufacturing process of a TFT according to at least one example embodiment may also be finished.

Figure 20:
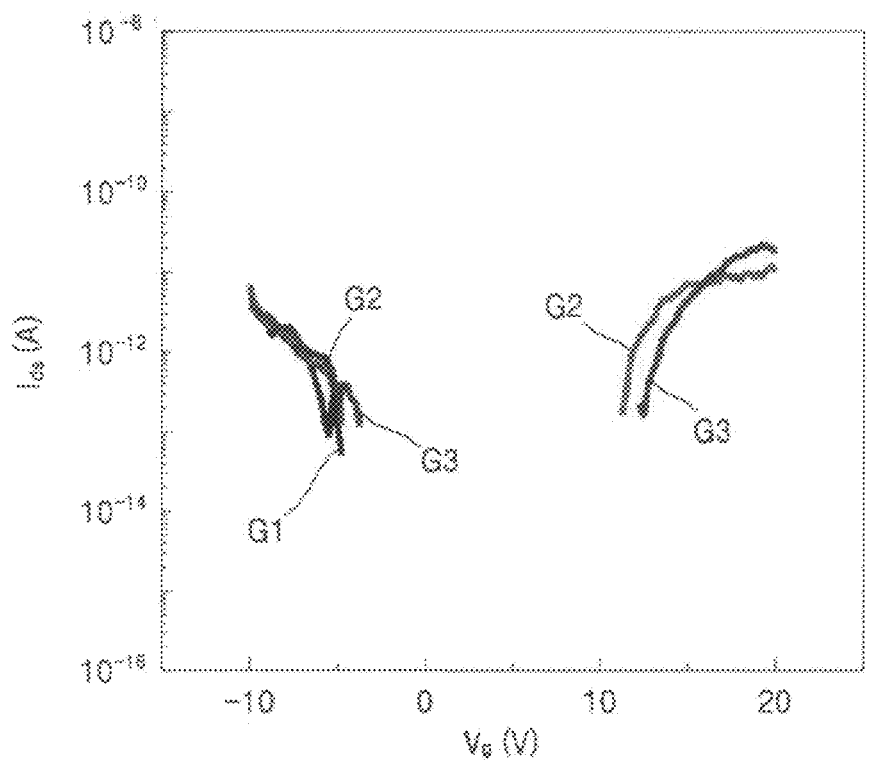
FIGS. 20 and 21 are graphs showing electrical characteristics of the TFT based on the annealing temperature in the method of manufacturing a TFT, according to at least one example embodiment.
Figure 21:
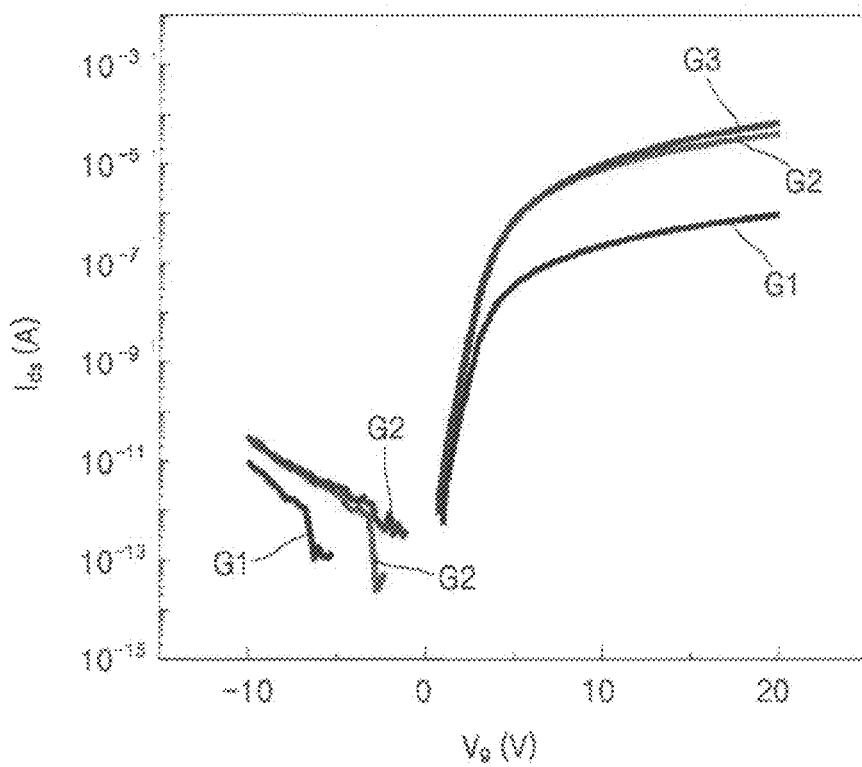

FIGS. 20 and 21 are graphs showing electrical characteristics of a TFT that was annealed, according to at least one example embodiment.

The TFT whose electrical characteristics are shown in FIGS. 20 and 21 may be formed of the metal layer 72 that may be formed by sequentially stacking a titanium layer and a platinum layer. The metal layer 72 may be formed to satisfy the geometric conditions of the source 50 and the drain 52 of FIG. 2, and the annealing may be performed using a furnace in an atmosphere containing nitrogen and oxygen. In FIGS. 20 and 21, first through third graphs G1 through G3 show the characteristics between a gate voltage $V_g$ and a source-drain current $I_{ds}$ when voltages of 0.1 V, 5 V, and 10 V are applied to the drain 52.

FIG. 20 is a graph showing the results without annealing, and FIG. 21 is a graph showing the results when annealing is performed at 350° C.

Referring to FIG. 20, as the gate voltage $V_g$ is increased greater than 10 V, a source-drain current is measured, however, the amount of source-drain current $I_{ds}$ may be significantly low, and may be regarded as no measured source-drain current $I_{ds}$.

On the other hand, referring to FIG. 21, as the gate voltage is increased greater than 0 V, a significant amount of source-drain current $I_{ds}$ may be measured.

As can be seen from the results of FIGS. 20 and 21, when no annealing is performed in the method of manufacturing a TFT according to example embodiment above, a metal oxide layer 80, as illustrated in FIG. 19, may not form between the metal layer 72 and the channel layer 48. However, when annealing is performed at the above-described temperature, the metal oxide layer 80 may be formed between the metal layer 72 and the channel layer 48.

Figure 22:
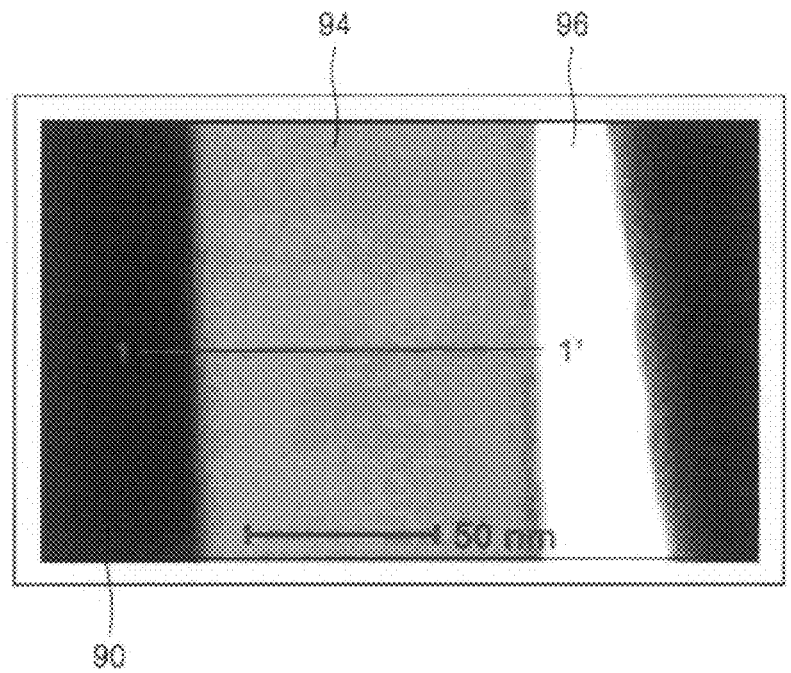
FIGS. 22 and 23 are photographic images of a silicon oxide layer, a channel layer, and a metal layer that are sequentially stacked when not annealed and when annealed at 350° C., respectively.
Figure 23:
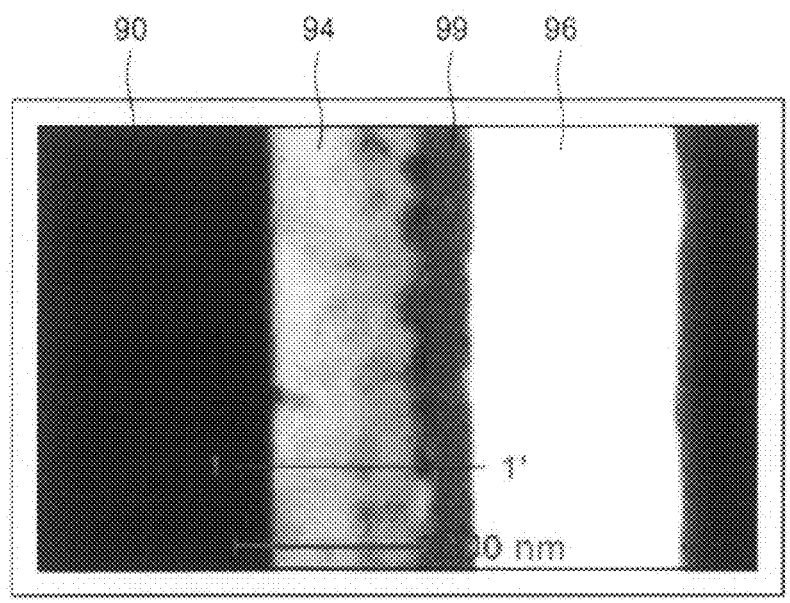

FIG. 22 is an image showing the resultant structure in which a silicon oxide layer 90, a channel layer 94, and a metal layer 96 are sequentially stacked and for which an annealing is not performed, and FIG. 23 is an image showing the structure in FIG. 22 where an annealing is performed at 350° C. The silicon oxide layer 90 is a SiO2 layer which may correspond to the gate insulating layer 46 of the TFT according to the at least one example embodiment; the channel layer 94 is a G-I—Z—O layer which may correspond to the channel layer 48; and the metal layer 96 is a Ti/Pt layer which may correspond to the metal layer 72. Reference numeral 99 will be described afterwards.

Figure 24:
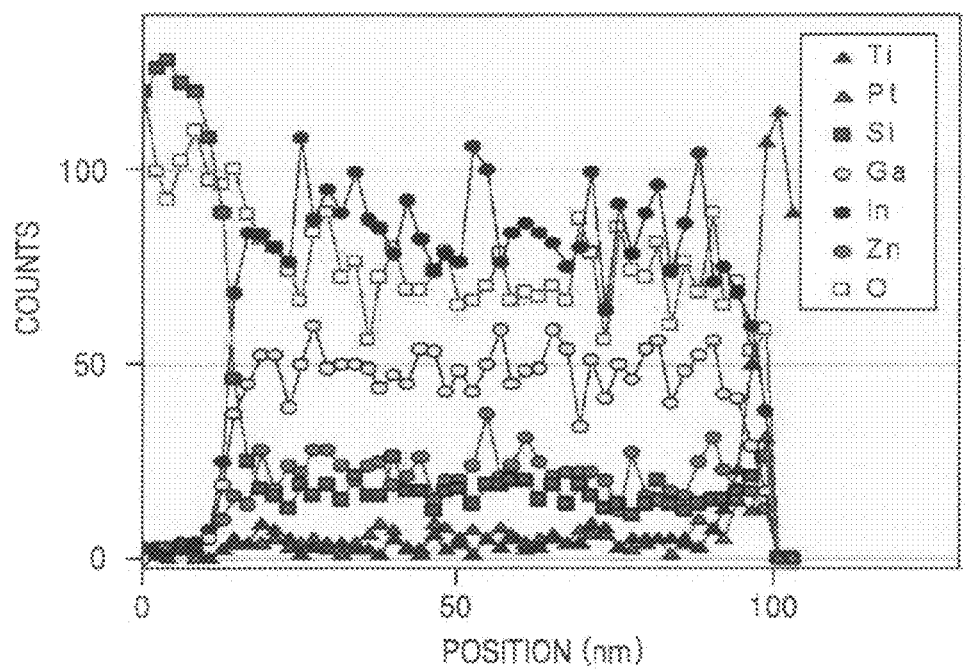
FIGS. 24 and 25 are graphs showing the material components along 1-1' of FIGS. 22 and 23.
Figure 25:
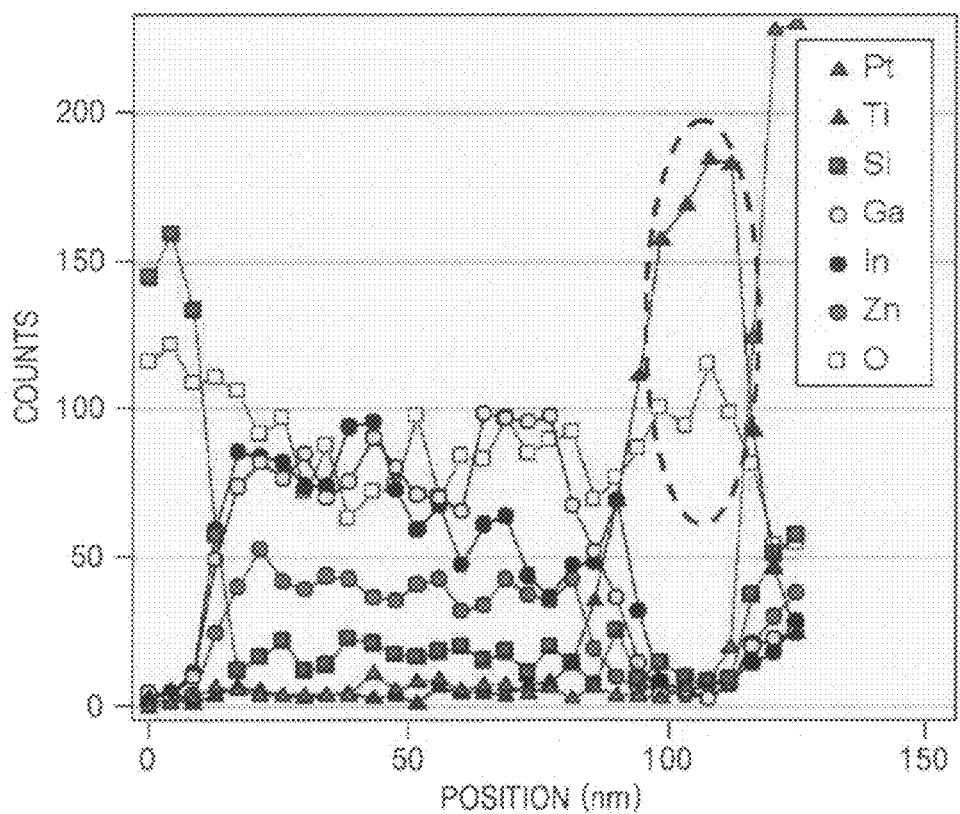

FIGS. 24 and 25 show the distribution of the material components along a line 1-1' of FIGS. 22 and 23.

Referring to FIG. 24, after the silicon oxide layer 90, the channel layer 94, and the metal layer 96 are sequentially stacked and the resultant structure is not annealed, about 100 counts of titanium were measured (▲) and 60 counts of oxygen are measured (□) in a position corresponding to the interface between the channel layer 94 and the metal layer 96.

Referring to FIG. 25, after the silicon oxide layer 90, the channel layer 94, and the metal layer 96 are sequentially stacked and the resultant structure is annealed at 350° C., about 150 counts or more of titanium were measured and 100 counts or more of oxygen are measured in a position corresponding to the interface between the channel layer 94 and the metal layer 96.

As can be seen from the results of FIGS. 24 and 25, in the method of manufacturing the TFT described with reference to FIGS. 17 through 19, when the resultant structure of FIG. 18 is annealed at 200~450° C., new layer 99 corresponding to the metal oxide layer 80 may be formed between the metal layer 72 and the channel layer 48.

Figure 26:
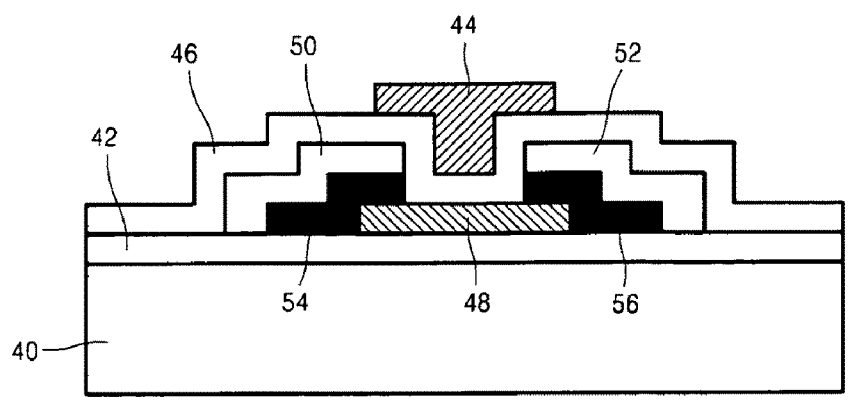
FIG. 26 is a cross-sectional view of a top gate TFT to which the example embodiments may be applied.

The above-described TFT is a bottom gate type TFT, however, as illustrated in FIG. 26, the example embodiments may also be applied to a top gate type TFT in which the gate 44 may be disposed above the channel layer 48. Additionally, the gate may be buried in the channel layer.

While example embodiments have been particularly shown and described, the example embodiments should be considered in descriptive sense only and not for purposes of limitation. For example, it will be understood by one skilled in the art that annealing may be performed before lifting off the photosensitive pattern P1. Additionally, various changes in form and details of each element of the TFT may be made or simply a new element may be inserted between elements. Therefore, the scope of the example embodiments is defined not by the detailed description of the example embodiments but by the appended claims.

As described above, the TFT according to example embodiments may include a metal oxide layer between a source and a drain which may be formed of metal, and a channel layer which may be formed of an oxide semiconductor. Accordingly, the TFT may operate in an enhanced mode, and thereby, may reduce its leakage current and increase its carrier mobility. As the source and the drain of the TFT may be formed of general metal, the manufacturing costs may be reduced as compared to the conventional TFT which may use indium for forming a source and a drain. In addition, in the TFT according to at least one example embodiment, contacts to the TFT or wirings connected to the TFT may be formed of the same material as the source and the drain, and thereby, may decrease the resistance caused by hetero-junction. In addition, the threshold voltage and the source-drain current $I_{ds}$ according to the gate voltage $V_g$ may be controlled by controlling the formation conditions of the metal oxide layer, for example, by controlling the thickness of the metal oxide layer.

Example embodiments having thus been described, it will be obvious that the same may be varied in many ways. Such variations are not to be regarded as a departure from the intended spirit and scope of example embodiments, and all such modifications as would be obvious to one skilled in the art are intended to be includes within the scope of the following claims.

What is claimed is:

1. A thin film transistor (TFT) including:
   a gate;
   a channel layer;
   a source and a drain, the source and the drain being formed of metal; and
   a metal oxide layer, the metal oxide layer being formed between the channel layer and the source and the drain, wherein the metal oxide layer has a gradually changing metal content between the channel layer and the source and the drain.

2. The TFT of claim 1, wherein the metal content in the metal oxide layer is gradually increased or decreased in a direction toward the channel layer.

3. The TFT of claim 1, wherein the metal oxide layer includes a transition metal having an oxidation characteristic higher than or similar to that of ZnO.

4. The TFT of claim 3, wherein the transition metal is one selected from the group consisting of Ti, Mo, Cr or W.

5. The TFT of claim 1, wherein the source and the drain are double-layers formed of metal.

6. The TFT of claim 1, wherein the channel layer is an oxide semiconductor layer.

7. The TFT of claim 6, wherein the oxide semiconductor layer is an $a(In_2O_3).b(Ga_2O_3).c(ZnO)$ or $a(In203).b(ZnO).c(SnO)$ (where a, b, and c are integers satisfying $a \geq 0$, $b \geq 0$, and $c > 0$, respectively).

8. The TFT of claim 1, wherein the metal contained in the metal oxide layer is the same as the metal of the source and the drain.

9. The TFT of claim 1, wherein the gate is formed above or under the channel layer or buried in the channel layer.

10. The TFT of claim 1, wherein the source and the drain are formed of at least one selected from the group consisting of Ti, Mo, Cr, W, Zr, Hf, Nb, Ta, Ag, Au, Al, Cu, Co, Sb, V, Ru, Pt, Pd, Zn, and Mg.

11. The TPT of claim 1, wherein the metal oxide layer includes a metal oxide which has a single metal, and the content of the single metal in the metal oxide gradually increases or decreases between the channel layer and the source and the drain.

12. The TFT of claim 11, wherein the metal oxide layer is made of a different material from the channel layer.

* * * * *